(12) United States Patent
Pasternak

(10) Patent No.: US 6,522,585 B2
(45) Date of Patent: Feb. 18, 2003

(54) DUAL-CELL SOFT PROGRAMMING FOR VIRTUAL-GROUND MEMORY ARRAYS

(75) Inventor: John H. Pasternak, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/865,320

(22) Filed: May 25, 2001

(65) Prior Publication Data

US 2002/0176280 A1 Nov. 28, 2002

(51) Int. Cl.[7] .............................................. G11C 16/06
(52) U.S. Cl. .............................. 365/185.21; 365/185.3; 365/185.22
(58) Field of Search ......................... 365/185.21, 185.3, 365/185.22

(56) References Cited

U.S. PATENT DOCUMENTS

| | | | |
|---|---|---|---|
| 4,630,086 A | 12/1986 | Sato et al. | |
| 5,172,338 A | 12/1992 | Mehrotra et al. | |
| 5,267,194 A | 11/1993 | Jang | |
| 5,272,669 A | 12/1993 | Samachisa et al. | |
| 5,554,868 A | 9/1996 | Hayashikoshi et al. | |
| 5,619,454 A | 4/1997 | Lee et al. | |
| 5,673,224 A | * 9/1997 | Chevallier et al. | 365/185.23 |
| 5,712,180 A | 1/1998 | Guterman et al. | |
| 5,768,192 A | 6/1998 | Eitan | |
| 5,909,392 A | 6/1999 | Chang et al. | |
| 5,930,174 A | 7/1999 | Chen et al. | |
| 5,963,465 A | 10/1999 | Eitan | |
| 6,005,807 A | 12/1999 | Chen | |
| 6,103,573 A | 8/2000 | Harari et al. | |
| 6,128,226 A | 10/2000 | Eitan et al. | |
| 6,134,140 A | * 10/2000 | Tanaka et al. | 365/185.03 |
| 6,134,156 A | 10/2000 | Eitan | |

OTHER PUBLICATIONS

Ahn, B.J., et al., "A Simple and Efficient Self–Limiting Erase Scheme for High Performance Split–Gate Flash Memory Cells", IEEE Electron Device Letters, vol. 19, No. 11, Nov. 1998, pp. 438–440.

Wu, A.T., et al., "A Novel High–Speed, 5–Volt Programming Eprom Structure With Source–Side Injection", IEDM Tech. Dig., 1986, pp. 584–587.

* cited by examiner

Primary Examiner—Huan Hoang
(74) Attorney, Agent, or Firm—Skjerven Morrill LLP

(57) ABSTRACT

A technique for controlling the soft-program current in virtual-ground FLASH memory arrays is described. It is based on biasing the array bit-lines such that all current supplied to the array is used entirely towards the soft-programming of selected cells. The result is control of the soft-programming current and the programming rate of individual cell pairs. The benefit of soft-programming is then realized during the actual cell programming with the improved control of current and program rate. This is described with respect to an embodiment that uses source-side injection as the means for programming memory cells and with respect to a second embodiment based on a cell with dual floating gates.

30 Claims, 12 Drawing Sheets

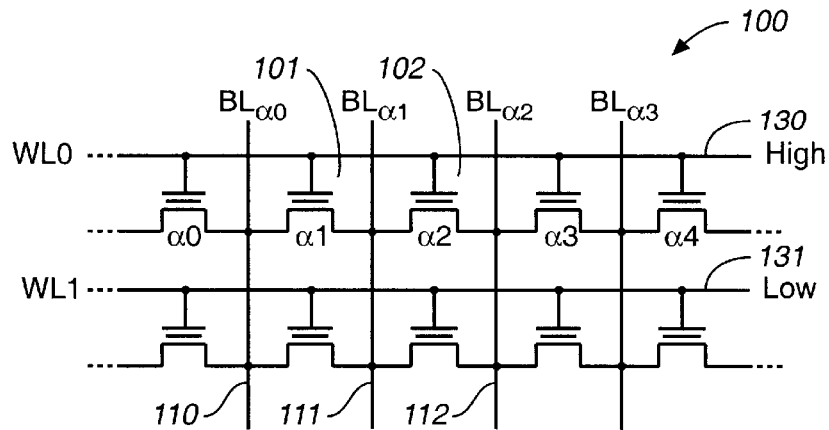
FIG._1a
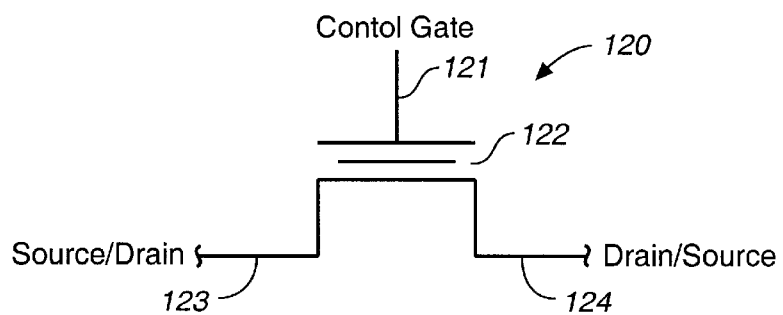
FIG._1b
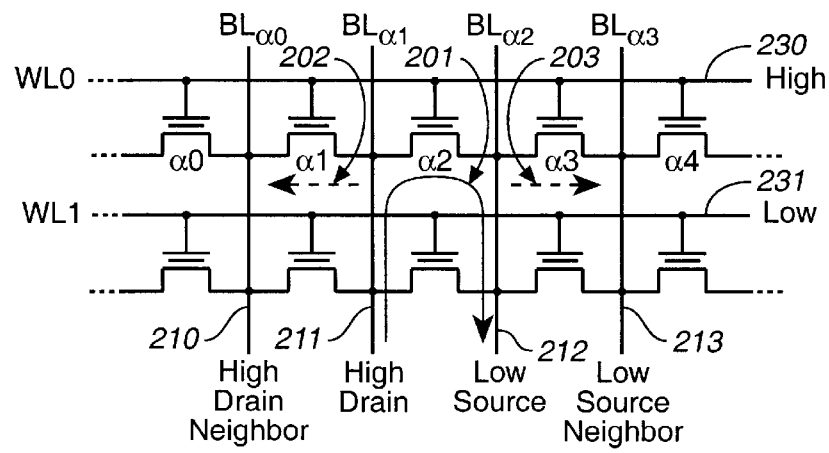
FIG._2

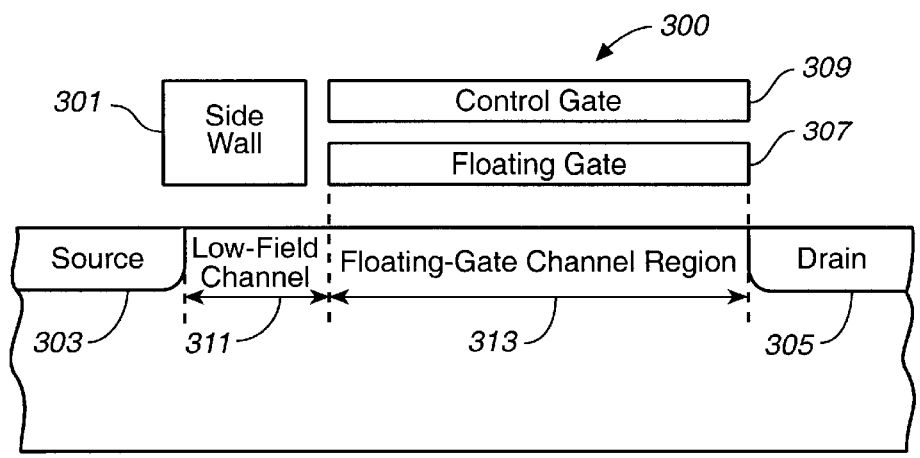
FIG._3a
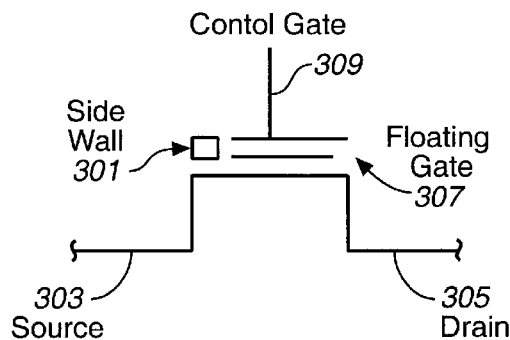
FIG._3b
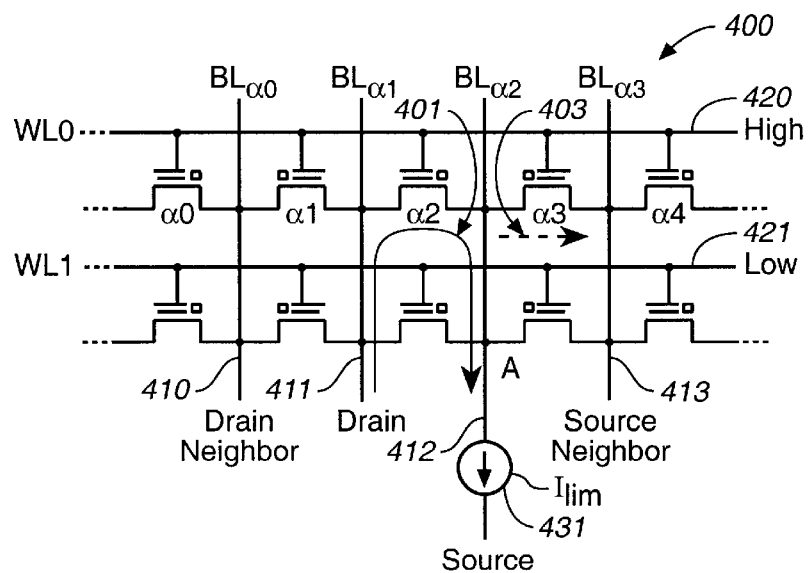
FIG._4

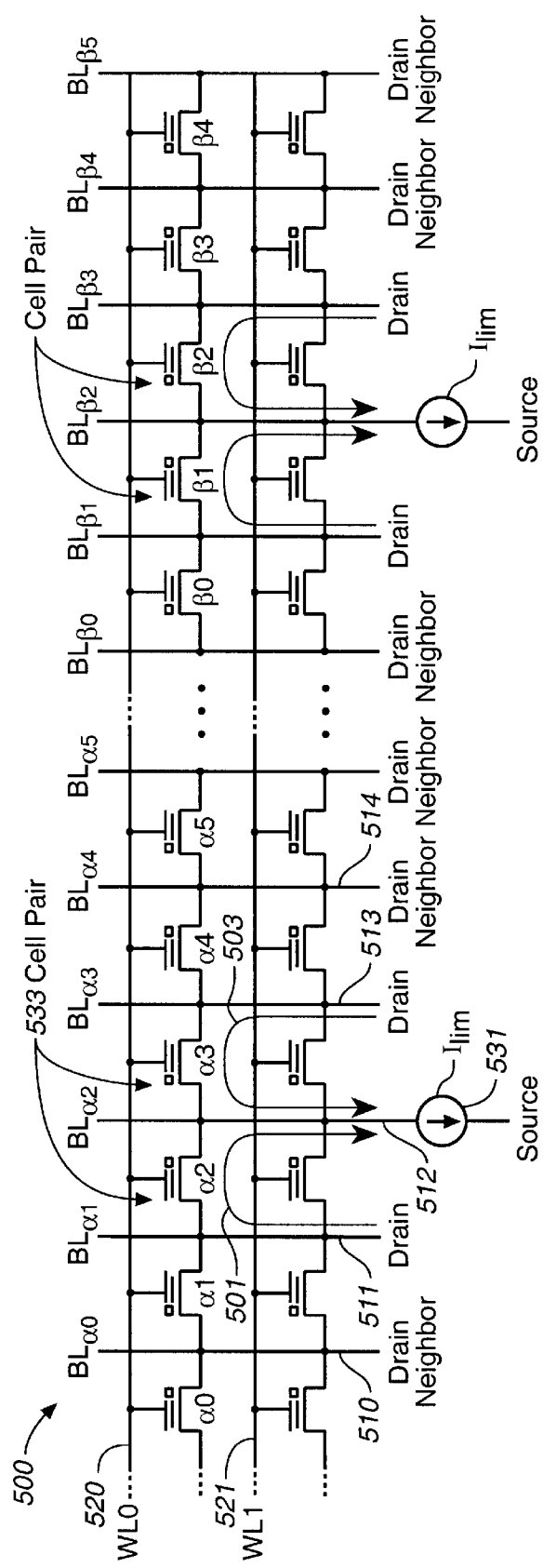
FIG._5

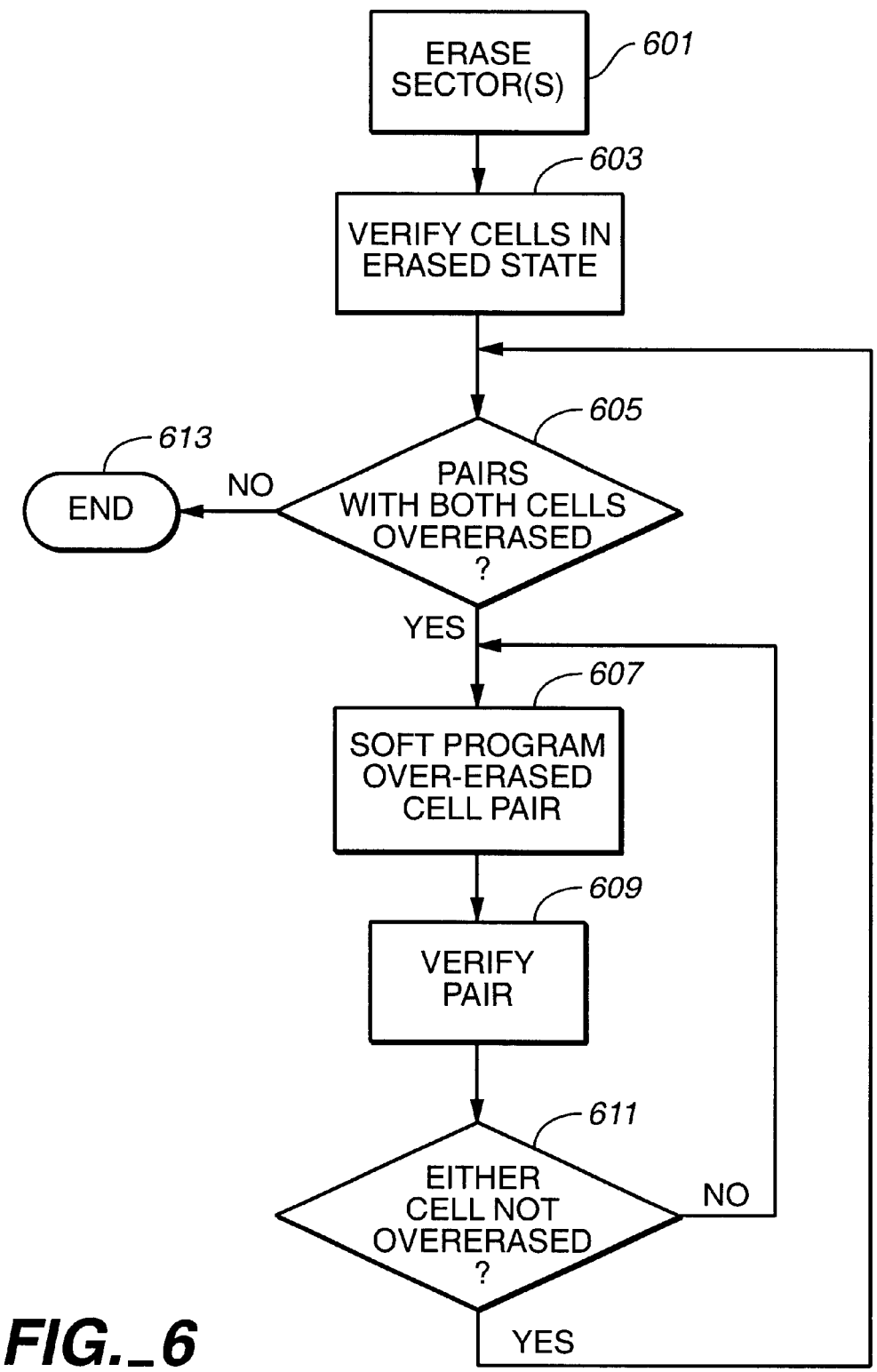
FIG._6

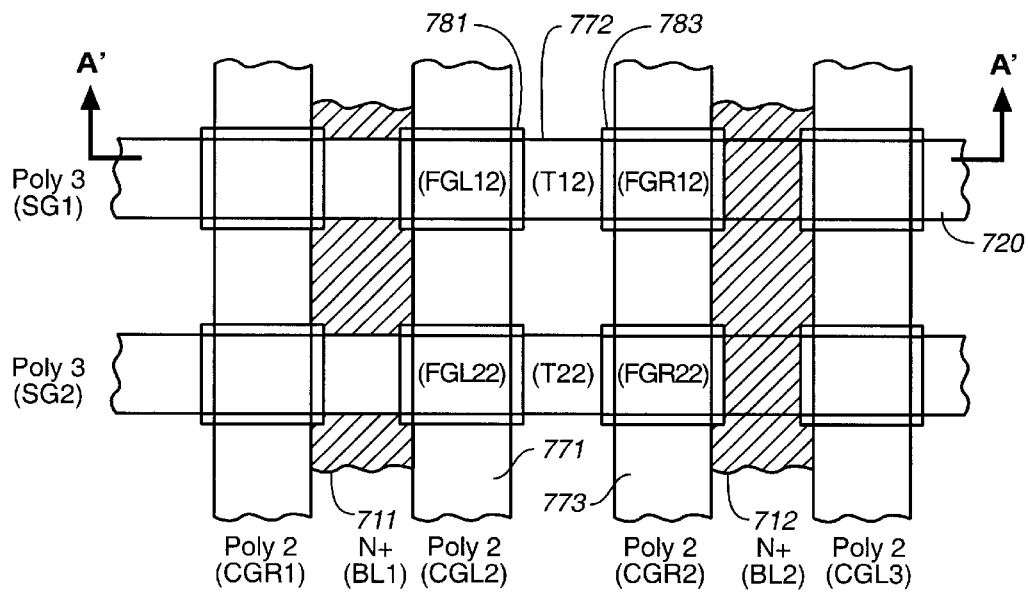
FIG._7a
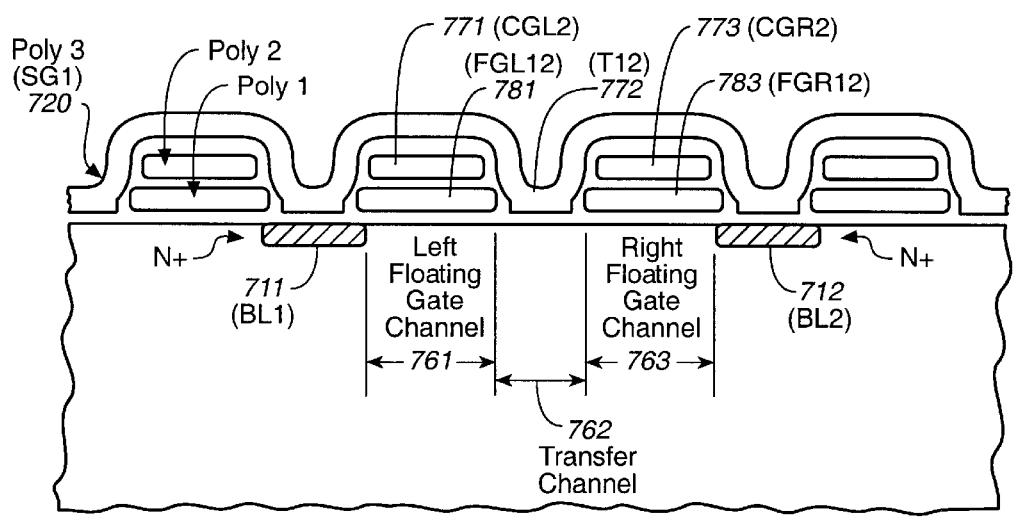
FIG._7b

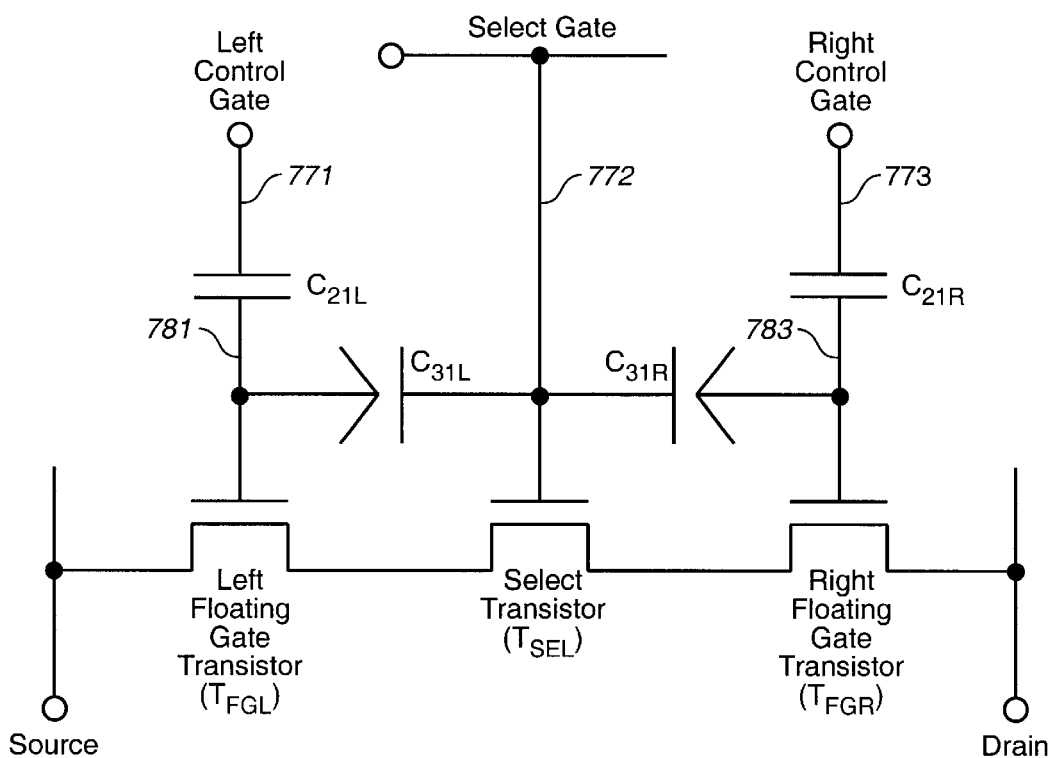
FIG._8a

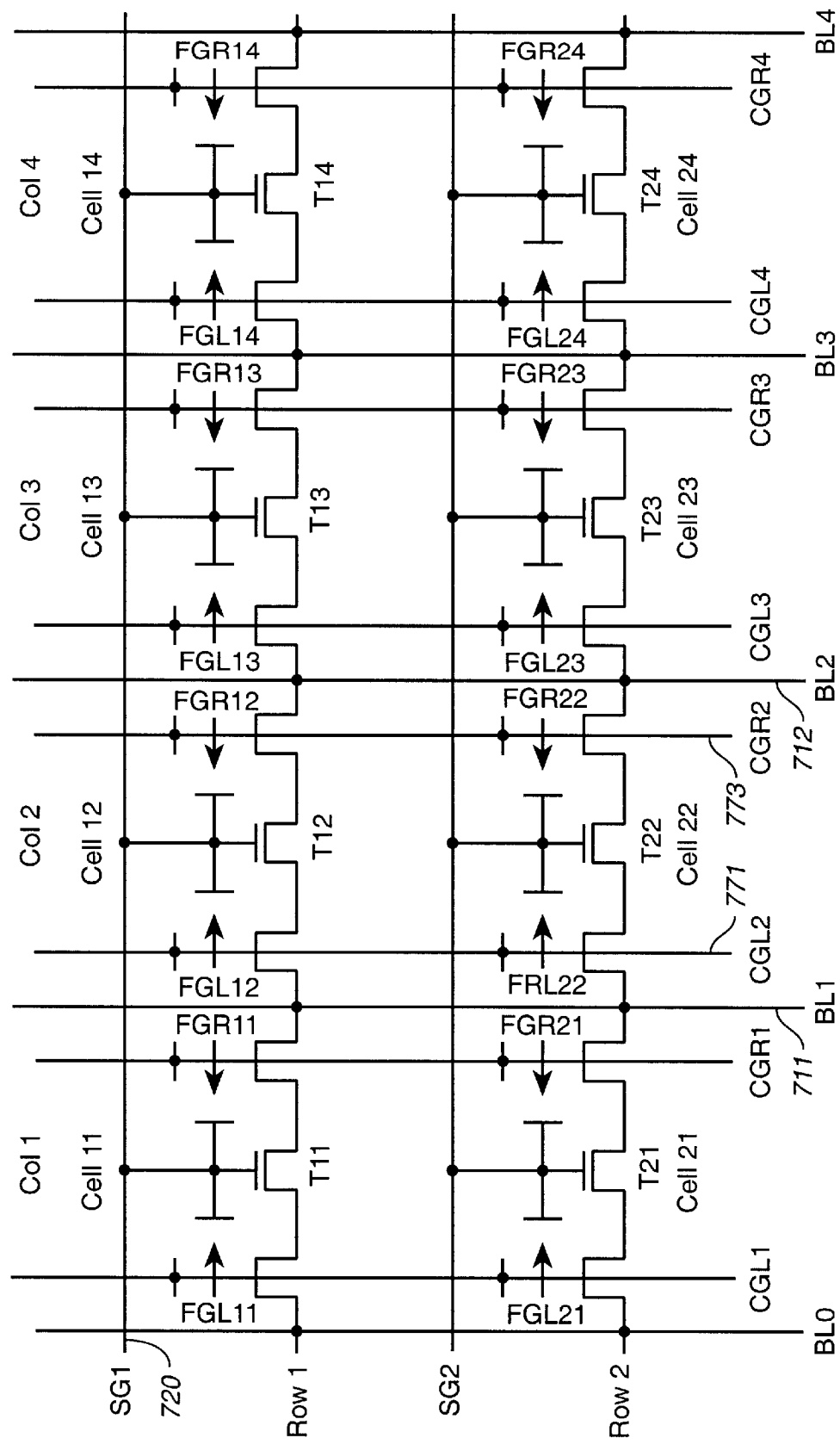
FIG._8b

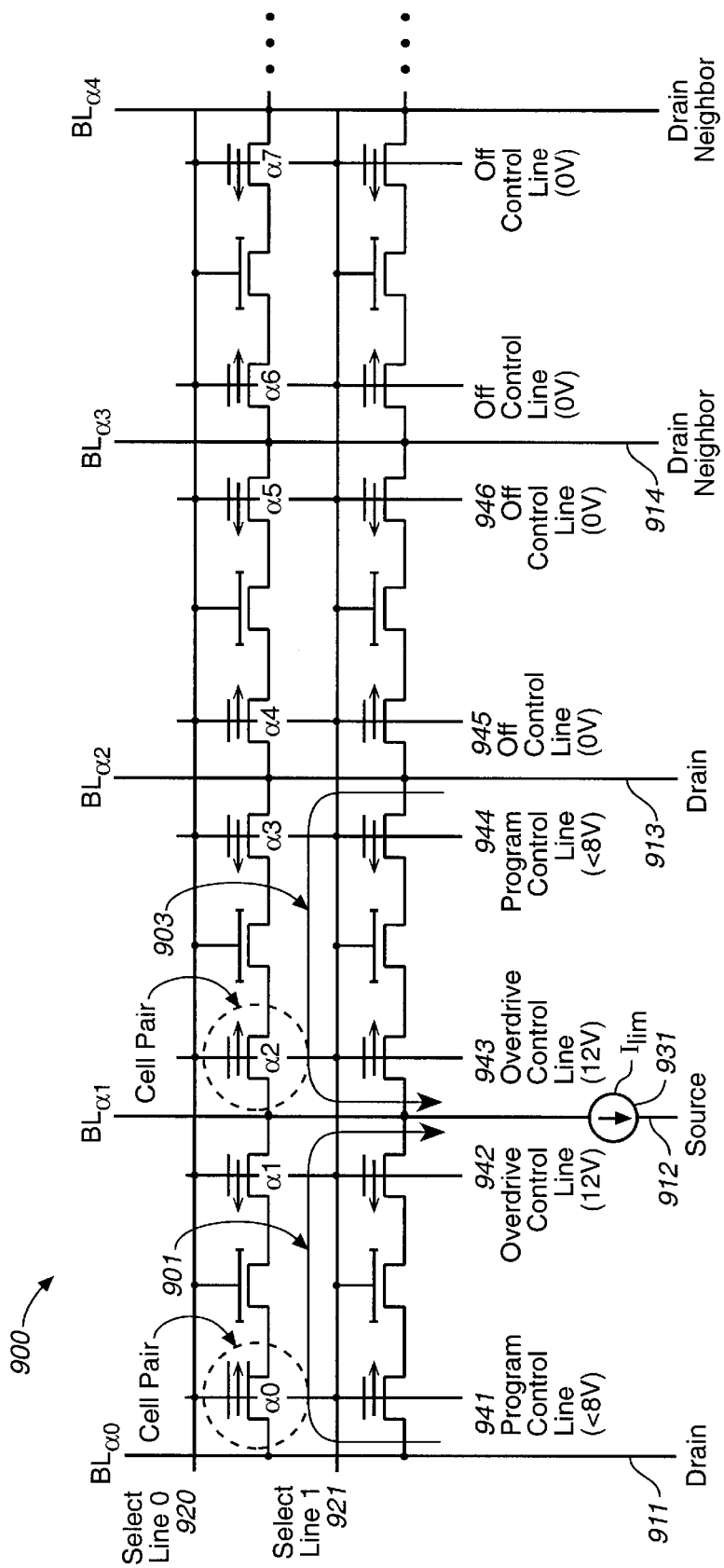
FIG._9a-1

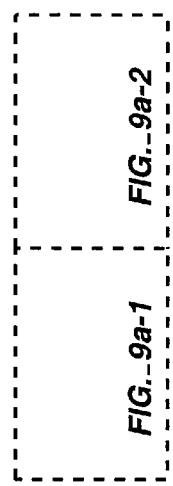
*FIG._9a*
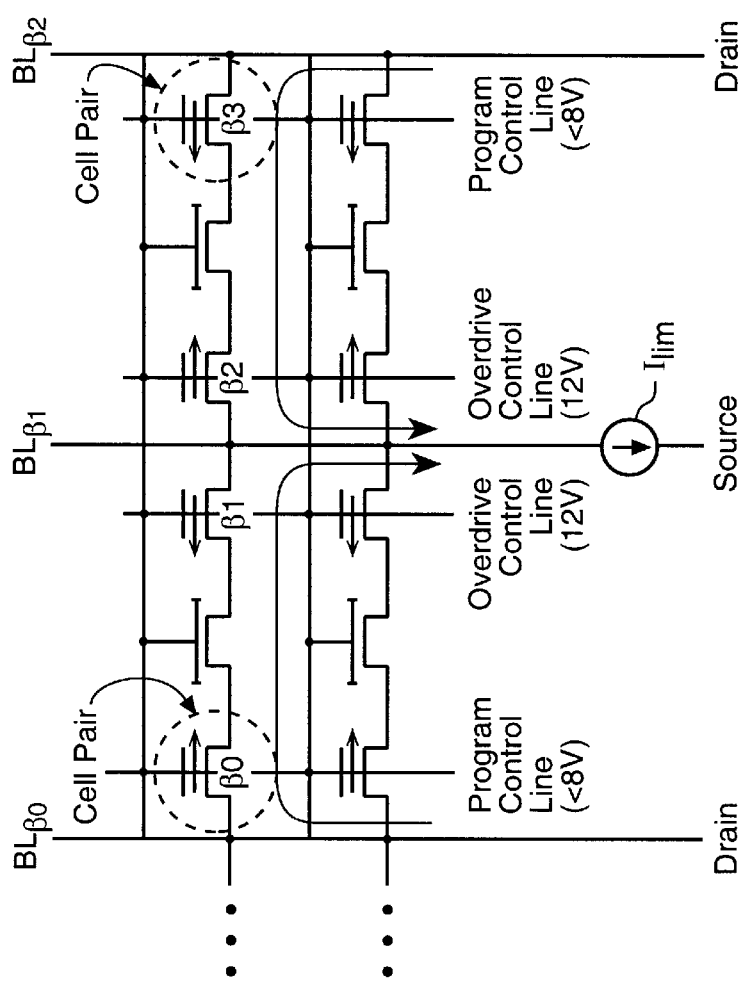
*FIG._9a-2*

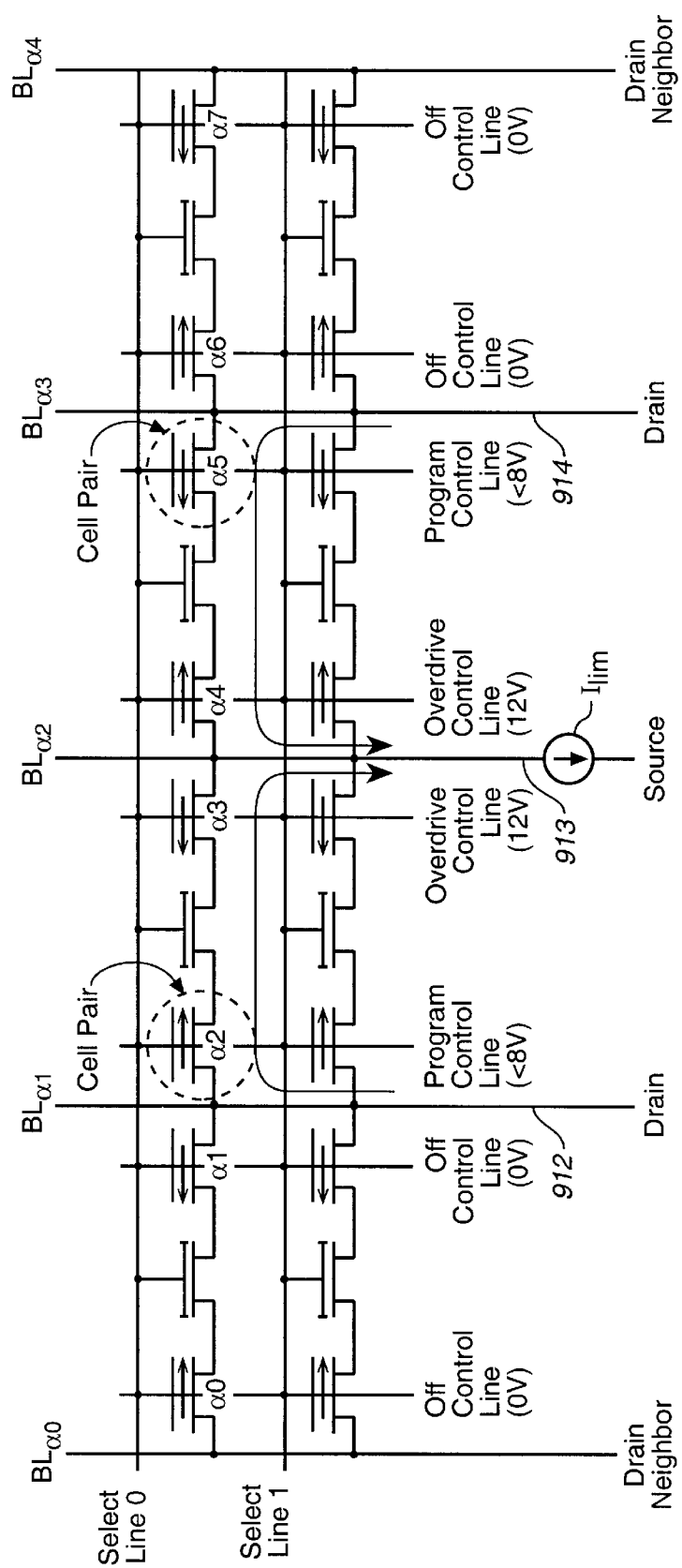
FIG._9b

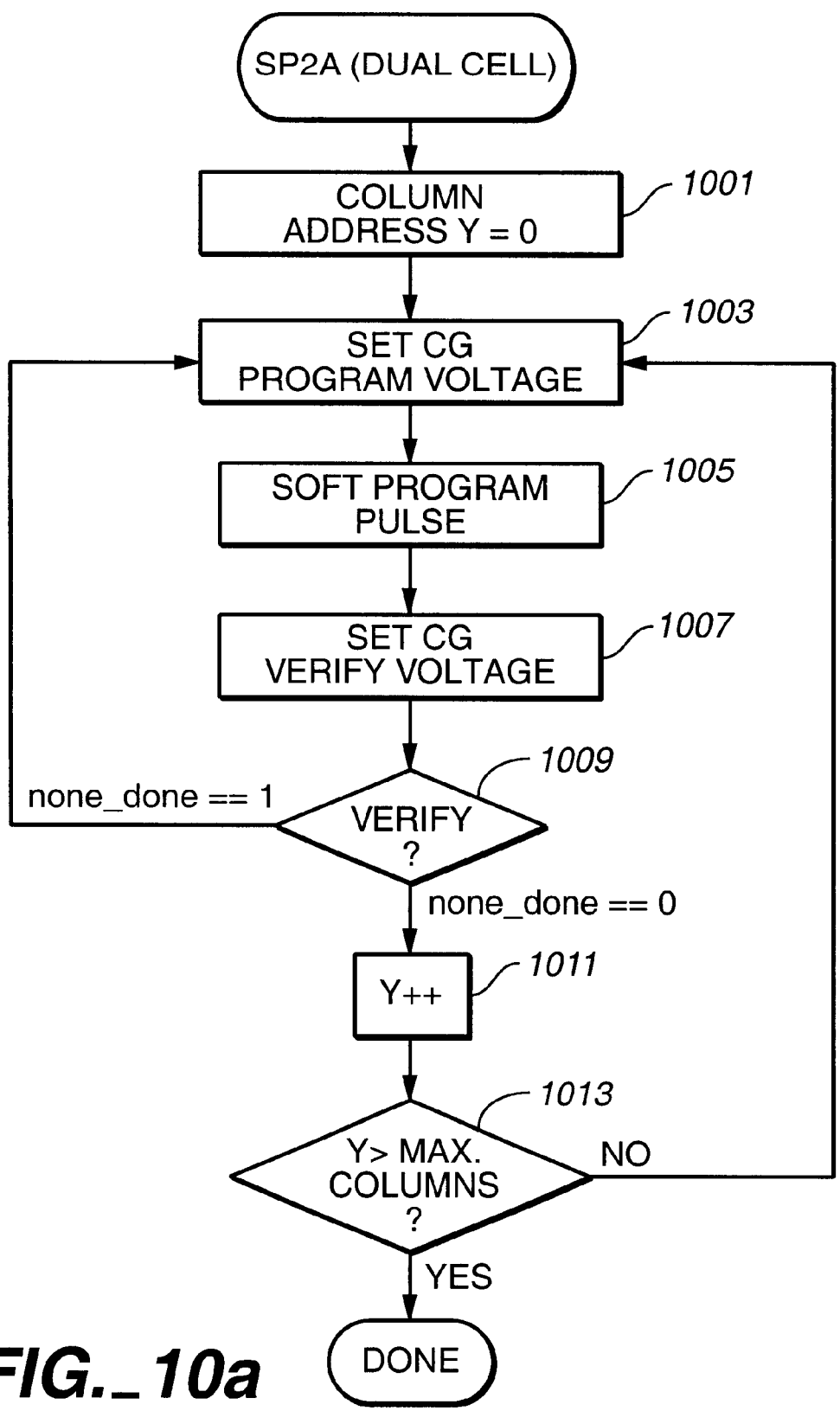
FIG._10a

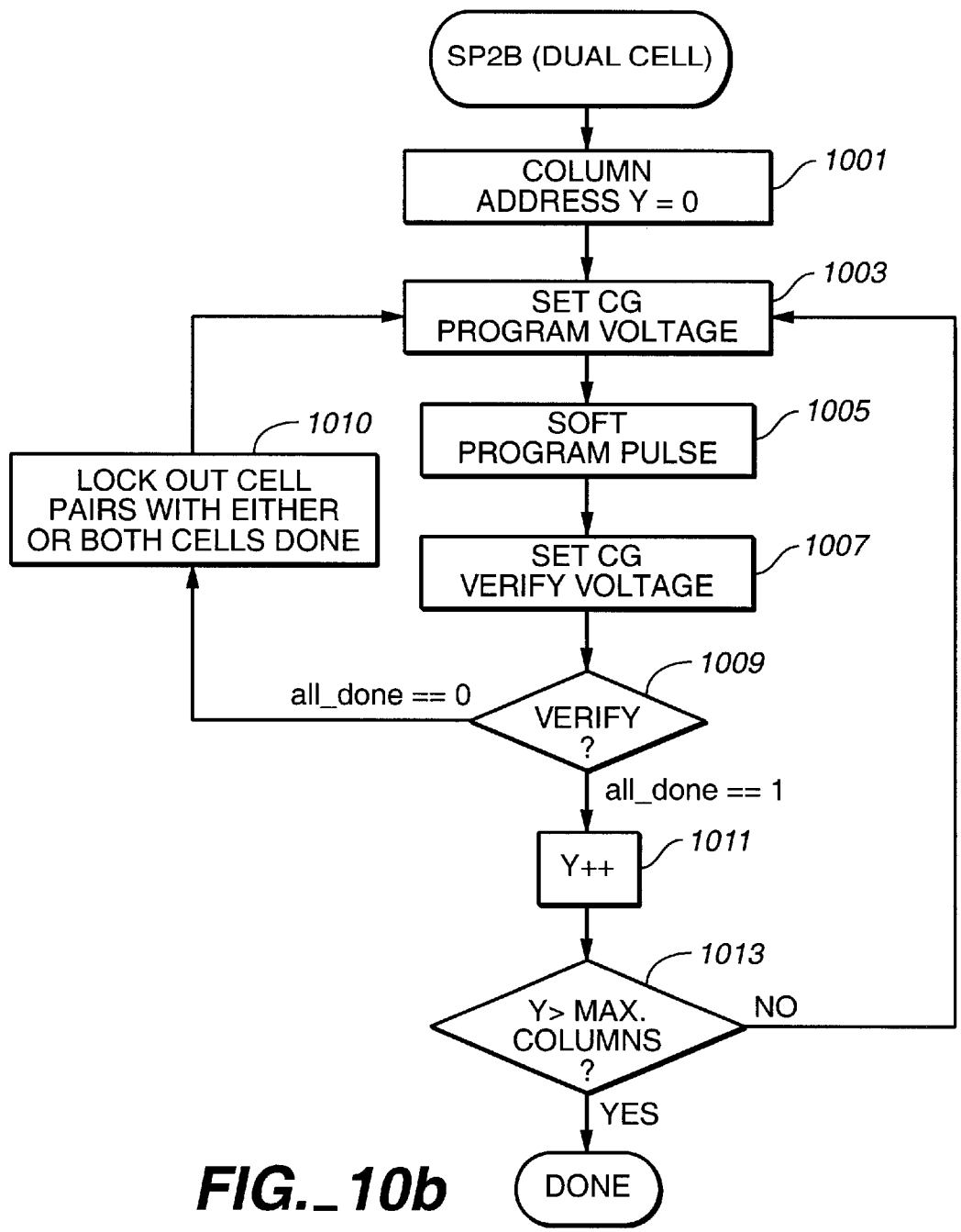
FIG._10b

DUAL-CELL SOFT PROGRAMMING FOR VIRTUAL-GROUND MEMORY ARRAYS

BACKGROUND OF THE INVENTION

1. Field of the Invention

This invention relates generally to non-volatile memories, and, more specifically, to methods for treating over-erased memory cells in electrically erasable and programmable read only memories (EEPROMs).

2. Background Information

A non-volatile memory (NVM) cell stores information by altering the control-gate voltage required to enable source-drain current conduction. This is known as the cell's threshold voltage, $V_t$. Programming is the operation used to raise this conduction threshold, while erase is an operation used to lower the cell's threshold. A virtual-ground architecture is one of a few schemes used to assemble NVM cells into arrays. A virtual-ground array offers relatively high area efficiency by allowing the adjacent cell to share access bit-lines.

A schematic of a virtual-ground array 100 is illustrated in FIG. 1a, with the various parts of an individual cell 120 also described in FIG. 1b. Here, vertical bit-lines connect NVM cell source and drain terminals, 123 and 124, while horizontal word-lines connect to the terminals of the control gate 121. The program status of a specific cell within the array is isolated for reading by applying the appropriate bit-line and word-line bias voltages. In FIG. 1, cell $\alpha_2$ 102 is read when word-line $WL_0$ 130 and bit-line $BL_{\alpha 1}$ 111 are biased high while bit-line $BL_{\alpha 2}$ 112 and word-line $WL_1$ 131 are set low. Alternatively, cell $\alpha_1$ is read when $BL_{\alpha 0}$ 110 is set low instead of $BL_{\alpha 2}$ 112. This array architecture derives its name from this use of ground bias in selecting individual cells instead of having dedicated source bit-lines. Further details on the virtual-ground architecture are given in J. Pasternak, et. al., "4 Mb Alternate Metal, Virtual Ground FLASH Memory," 1998 NVSM Workshop, Monterey, Calif. (USA), which is hereby incorporated by this reference, and also in the other reference incorporated below.

An important consideration for virtual-ground operation is the influence of neighboring cells on the selected cell. Neighbor cells can draw current away from the cell being accessed; an unwanted situation since it interferes with the accuracy and efficiency of both read and program operations. This neighbor effect is typically reduced by biasing neighboring bit-lines to the same levels as those accessing the cell, as illustrated in FIG. 2. Here, a current 201 is flowing in cell $\alpha_2$, for example during reading or programming, by setting the drain, connected to $BL_{\alpha 1}$ 211, and control gate, connected to word-line $WL_0$ 230, both high, while the source, connected to bit line $BL_{\alpha 2}$ 212, and other word-lines are low. A current in the neighboring cells $\alpha_1$ and $\alpha_3$, respectively due to the drain-neighbor leakage 202 or source-neighbor leakage 203, may also be induced unless these cells are biased properly with a high drain neighboring bit-line $BL_{\alpha 0}$ 210 and the low source neighboring bit-line $BL_{\alpha 3}$ 213.

By definition, FLASH-cell erasure requires the erase of at least an entire sector, which is usually a word-line, of cells. Due to differences in erase rates of the various cells on this common word-line, cells may often erase beyond the maximum lower threshold voltage needed to reliably indicate an erased state. As a result, neighbor effects are significantly enhanced for these over-erased cells. Soft programming is a technique used to gently raise the thresholds of over-erased cells prior to the actual data programming.

Prior art methods for treating over-erased cells include individually programming the over-erased cells until they are in the erased, or "ground" state. More details on some of these techniques can be found in U.S. Pat. Nos. 5,172,338 and 5,272,669, both of which are assigned to SanDisk Corporation and both of which are hereby incorporated herein by this reference.

Source-side injection is one of the many mechanisms that can be used to program an NVM cell. FIG. 3a shows a device cross-section of a structure for programming by source-side injection, with its schematic symbol shown in FIG. 3b. The cell 300 shown in these figures has a source 303 and drain 305 that define the channel region between them, over which is the control gate 309 and the floating gate 307 as well as the side-wall 301. This structure generally requires a low-conductive channel region 311 near the source side of the device, and a highly conductive, floating-gate channel region 313. In this device, the lateral field along the channel is enhanced at the floating gate's source side through the combination of the side-wall and floating-gate channel regions. The sidewall device 301 is biased through coupling from the relatively high control gate voltage needed for programming. More detail on source-side injection is given, for example, in A. T. Wu, T. Y. Chan, P. K. Ko, C. Hu, "A Novel High-Speed, 5-Volt Programming EPROM Structure with Source-Side Injection," 1986 IEDM Technical Digest, pp. 584–587, which is hereby incorporated herein by this reference.

In order to limit the total soft-program current and also control the soft-program rate, the cell's programming current can be controlled from the source-side when using source-side injection. A complication to this approach for virtual-ground arrays is the source-neighbor effect due to over-erased cells. FIG. 4 shows a program current applied to cell $\alpha_2$ using a source-limit circuit in a virtual ground array of cells like those of FIG. 3a in the situation where neighboring cell $\alpha_3$ is over-erased. To program cell $\alpha_2$, the current 401 is set up by setting bit-line $BL_{\alpha 1}$ 411 and word-line $WL_0$ 420 high. The other word-lines, such as $WL_1$ 421, are set low. The program current 401 is then controlled by the current limiter 431 on the source bit-line $BL_{\alpha 2}$ 412. Although the bit-line $BL_{\alpha 2}$ 412 is connected to ground below 431, the voltage level at node A is some non-zero value that is dependent on the characteristics of the cell $\alpha_2$ and is very dynamic. Since the source neighbor bit-line $BL_{\alpha 3}$ 413 is at ground and the word-line $WL_0$ 420 is high, instead of the programming current flowing solely through the current-limit circuit 431, an uncontrolled source-neighbor leakage current 403 runs through cell $\alpha_3$ and out through source-neighbor bit line $BL_{\alpha 3}$ 413.

This resultant uncontrolled current through cell $\alpha_3$ results in a number of problems. A first problem is power consumption. This $\alpha_3$ sort of leakage is an uncontrolled flow of current. As a large number of cells are generally programmed in parallel, this results in greatly increased power consumption, which is a particular problem in low power applications. A second problem is that since the amount of current 403 flowing in cell $\alpha_3$ cannot be controlled, the current 401 in the cell to be programmed can not be controlled accurately. The more current flowing through $\alpha_2$, the faster it will program. Thus, by not being able to control the current accurately, a greater variation in the program rates of the cells being programmed results. Additionally, if the cell $\alpha_2$ is over-erased, it will draw more current, further compounding the programming rate problem.

Therefore, a solution to this problem of improving the control of the soft-programming current in a virtual ground arrays is needed.

SUMMARY OF THE INVENTION

The present invention is directed to controlling programming current in a virtual-ground array memory architecture. The invention consists of circuitry to bias the array such that no source neighbors occur during soft programming. A feature of this bias configuration is that two cells are simultaneously soft-programmed. This dual-cell operation relies on the fact that neighbor cells will have similar electrical characteristics and will therefore program at a similar rate.

In one exemplary embodiment, the cells of the non-volatile memory array are programmed by a source side injection mechanism. Adjacent cells along a word-line share a common source line and are programmed together until one of the cells is verified to have the desired threshold value. The number of bit-lines between source lines can be as few as one, the actual drain required for programming. An additional means for controlling the soft-program rate is realized through the choice of the word-line voltage applied.

Another exemplary embodiment uses memory cells with multiple floating gates. In this embodiment, the floating gate transistors within a cell are soft programmed separately from each other, but as part of a pair formed with a floating gate transistor in an adjacent cell.

In any of the embodiments, more than one such pair, each from a separate block, may be soft-programmed simultaneously. The process can continue until either a first of these pairs, or until all of these pairs, no longer have both members of the pair over-erased.

Additional aspects, features and advantages of the present invention are included in the following description of specific representative embodiments, which description should be taken in conjunction with the accompanying drawings.

BRIEF DESCRIPTION OF THE DRAWINGS

FIG. 1a shows a virtual ground array architecture for a non-volatile memory.

FIG. 1b described the various parts of a cell in FIG. 1b.

FIG. 2 illustrates neighbor effects in a virtual ground array.

FIG. 3a shows structure and bias for source-side injection in a device cross section.

FIG. 3b is a schematic symbol for the device of FIG. 3a.

FIG. 4 shows program current by source limit current in a virtual ground array.

FIG. 5 illustrates dual cell soft program bias for a virtual ground array.

FIG. 6 is a flow chart for one embodiment of the process of FIG. 5.

FIGS. 7a and 7b are top and cross-sectional views, respectively of one embodiment of a memory cell structure with multiple floating gates.

FIG. 8a is a schematic diagram of a memory cell such as those of FIGS. 7a and 7b.

FIG. 8b is a circuit diagram depicting one embodiment of an array of memory cells such as those of FIGS. 7a and 7b.

FIGS. 9a and 9b show dual cell programming in an array of multiple floating gate cells.

FIGS. 10a and 10b present algorithms that can be used in the soft programming of FIGS. 9a and 9b.

DESCRIPTION OF REPRESENTATIVE EMBODIMENTS

The various aspects of the present invention will be described with using more than one embodiment for the non-volatile memory cells composing the memory array. The initial discussion is based on the cell structure shown in FIGS. 3a and 3b. This is followed by a discussion using an array of memory cells with dual floating gates.

The invention is directed to controlling programming current in a virtual-ground array memory architecture. The invention consists of circuitry to bias the array such that no source neighbors occur during soft programming. A feature of this bias configuration is that two cells are simultaneously soft-programmed. This dual-cell operation relies on the fact that neighbor cells will have very similar electrical characteristics and will therefore program at a similar rate. This is illustrated in FIG. 5, which is similar to FIG. 4 and depicts two groups of array cells ($\alpha$ and $\beta$) within a larger array.

FIG. 5 again shows a pair of words-lines, selected word-line $WL_0$ 520 and $WL_1$ 521 to represent the non-selected word-lines. Within an array, the cells are usually broken down into a number of groups of columns based on how the cells are simultaneously read and programmed, and which is reflected by the architecture used for the column decoders and sense amplifiers. In FIG. 5, the $\alpha$ cells and $\beta$ cells are two such groups which (along a given selected word-line) can be read and programmed separately and simultaneously.

To avoid the sort of source-neighbor leakage described in the Background section and treat over-erased by soft programming, the non-volatile memory cells are soft-programmed in pairs. By biasing the bit-lines accordingly, a pair of adjacent cells that shares a common source programmed together. In FIG. 5, cells $\alpha_2$ and $\alpha_3$ share a common source line $BL_{\alpha 2}$ 512 for programming, with the current through both flowing out through current-limit circuit 531 to ground. The cells' respective drain lines, $BL_{\alpha 1}$ 511 and $BL_{\alpha 3}$ 513, are both set high, along with any of the drain neighbor bit-lines such as 510 and 514. This eliminates the uncontrolled source-neighbor current and the consequent problems that result. The combination of individual currents 501 and 503 is controlled by the current-limit circuit 531, these will generally be about the same value, but with that in the more over-erased cell slightly higher, as described below. Similarly, cells $\beta_1$ and $\beta_2$ share the common source line $BL_{\beta 2}$ and are programmed as a pair in the same way. The number of bit-lines between source lines can be as few as one, the actual drain required for programming. An additional means for controlling the soft-program rate is realized through the choice of the word-line voltage applied to the control gates.

In a normal programming operation, the drain is usually set in a range of 4 to 7 volts, say 5 volts and the source is set to ground below the current limiter 531. The actual voltage on the source of the transistor depends on the cell characteristics that vary across the array. All of the cells in a column will be biased the same way. The word-lines of the selected cells are then pulsed with the programming voltage, usually in the range of 5–10 volts when data is being stored on the cell. The side-wall is capacitively coupled to the control gate and the programming voltage causes the electrons flowing through the channel to be injected into the floating gate.

For soft programming, a lower voltage in the range of 0–2 volts is applied to the control gate. This serves to gradually move the over erased cells' thresholds up toward the ground state. In the soft programming process, one of the motivations for using the lower voltage on the control gate is to avoid over-shooting this ground state, since the purpose is to establish a more uniform starting point for programming actual information into the cell and not to accidentally take it above the ground state.

The circuits that set the various voltages will be part of the decoders and circuit drivers that form the peripheral elements in the circuit array. These are described more fully in U.S. Pat. Nos. 5,172,338 and 5,272,669, which were incorporated by reference above, and in the additional patents and patent applications which are incorporated by reference below in relation to the multiple floating gate embodiment.

The arrangement of FIG. 5 can be used in a number of ways, one of which is shown in the process of FIG. 6. In step 601, one or more sectors are erased. These cells are then verified in step 603 and in step 605 it is determined if there are any cell pairs where both cells are over-erased. If not, the process ends at step 613; if so, the cells are soft-programmed in pairs.

In this embodiment, the cells within a pair are soft programmed until a first one of the cells verifies. Thus, one cell will be programmed to a level determined by another cell. As process variations are relatively small over distances on the order of an individual cell, neighbor cells will generally have very similar electrical characteristics and, consequently, will program at a similar rate. Therefore, by stopping the soft programming when a first cell of the pair verifies, the second cell should generally also be quite close to the desired level.

Returning to FIG. 6, the soft programming occurs in steps 607–611. In step 607, a soft programming pulse is applied to a cell pair. A verify is performed in step 609 to see if either cell in the pair is in the desired state and no longer over-erased. If not, the flow loops back from step 611 to step 607 to continue soft programming the pair until one of the cells verify. Generally, a maximum number of cycles is also set to cover the case where both cells of the pair are bad. Once the pair is done, the process loops back from step 611 to step 605. If there are additional pairs to soft program, one of these is selected and soft programmed as the previous pair. Once all pairs are finished, the process ends at step 613.

So far this discussion has been based on an embodiment using the cell of FIG. 3, but may more generally be applied in arrays composed of cells with other architectures. Another exemplary embodiment uses cells with a multiple floating gate structure. Non-volatile memory cells with this structure are described in U.S. Pat. Nos. 5,712,180 and 6,103,573 and U.S. patent applications Ser. No. 09/505,555, filed on Feb. 17, 2000, and one entitled "Non-Volatile Memory Cell Array Having Discontinuous Drain and Source Diffusions Contacted by Continuous Bit Line Conductors and Methods of Forming" by Jack H. Yuan and Jacob Haskell, field on Sep. 22, 2000, which are all assigned to SanDisk Corporation and which are all hereby incorporated herein by this by reference. These cells can store more than four logical bits per physical floating gate storage transistor. As much of the discussion is based on the array structure and not that of the cells, other embodiments using non-volatile memories without floating gates can also be used. For example, NROM or MNOS cells, such as those described in U.S. Pat. No. 5,768,192 of Eitan and U.S. Pat. No. 4,630,086 of Sato et al. which are both hereby incorporated herein by this reference, could also be used.

FIGS. 7a and 7b show top and cross-sectional views, respectively, of one embodiment of a memory cell structure with multiple floating gates and are adapted from U.S. Pat. No. 5,712,180 that was included by reference above. As shown in the cross-sectional view of FIG. 7b, a channel of the cell is formed between the two source/drain regions of bit-lines BL1 711 and BL2 712. The channel is subdivided into three regions: a left floating gate channel 761 under the left floating gate FGL12 781 and left control gate CGL2 771; a right floating gate channel 763 under the right floating gate FGR12 783 and right control gate CGR2 773; and, between these, a transfer channel 762 underneath the select transistor T12 772.

As shown in FIG. 7a, in this structure the word-lines, such as SG1 720, cross the bit-lines, such as BL1 711 and BL2 712, to form the array. The memory cell locations within the array are then defined by the intersection of these lines; for example, the cell of FIG. 7b with select transistor T12 772 lies along word-lines SG1 720 between BL1 711 and BL2 712. The control gates, however, are now connected along the columns parallel to the bit-lines instead of along the rows as in the more common architecture such as in the array of FIGS. 1–5. Thus, by applying a voltage to the control gate line CGL2 771, this is voltage is applied not just to the gate of the cell containing transistor T12 772, but also the left control gates of all of the cells in the column between bit-lines BL1 711 and BL2 712.

FIG. 8b is a circuit diagram depicting one embodiment of an array of memory cells such as those of FIGS. 7a and 7b, where FIG. 8a is an equivalent circuit of these memory cells. The floating gates 781 and 783 of the cell can be programmed and read independently. For example, to program the right floating gate 783 in FIG. 8a, an overdrive voltage of, say, 12 volts is applied to the left control gate 771. The actual value is not critical, but is taken to be enough to fully turn the left floating gate transistor $T_{FGL}$ on regardless of the data state stored on its floating gate. With the left floating gate transistor $T_{FGL}$ effectively removed from the circuit, the right floating gate transistor $T_{FGR}$ can be programmed much as the transistor of FIG. 3 is programmed through the source-side injection method.

In a regular programming operation, the drain is again set at around 5 volts, or more generally 4–7 volts, and the source is set at ground and/or connected to ground through a current limiting device. All of the cells in the column will be in the same condition. For the selected rows, a voltage of 1.5–3 volts is placed on the select gate, thereby turning on the select transistor. This induces a current through the channel, with the electrons entering at the source-side. In non-selected rows, the select gate line, or word-line, is held at ground and these select transistors are held turned off. The programming voltage of, say, 5–10 volts is then applied to the right control gate. These values induce a high electric field in the channel region between the select transistor and the right floating gate transistor, the same as occurs in the channel of the device in FIG. 3a between the region between the side wall and the floating gate. In that case, however, the side-wall was only capacitively to the control gate, whereas now it can be independently controlled by the select gate line. In either case, the result is that electrons entering from the source are injected into the (right) floating gate in response to the programming voltage. To program the left floating gate, the roles of the left and right control gates are reversed, as are the source and drain.

The cell can be erased by applying the erase voltage to the select gate, so that both the left and the right floating gates are erased through their respective couplings of $C_{31L}$ and $C_{31R}$, or through other methods, such as channel erase. More details on erase and other operations are given in U.S. Pat. No. 5,712,180, which was incorporated by reference above.

FIG. 8b shows a portion of an array composed of two rows and four columns of these cells. As the cells are erased through their select gates, both floating gates of all the cells on a common select gate line, such as SG1 720, will all be erased together and will belong to the same FLASH sector. This is a similar arrangement to what is usually found in an array of single floating gate cells such as FIG. 1. As the control gate lines, such as 771 and 773, now run in columns parallel to the bit-lines, and since they all have their source and drains set to the same level, all of either the right or left floating gates in a column can be programmed together since the programming voltage is applied to the entire control gate line. Which cells in the column are programmed is determined by how select gate lines are biased. Thus all of either the right or the left floating gates in a column are available to be programmed together in each of the different regions, such as the $\alpha$ and $\beta$ regions in FIG. 5, by selecting the appropriate word-lines. This is true for both regular programming and soft programming, the difference being that for soft programming a lower voltage is used. Instead of the 5–10 volts used for programming information, a voltage of less than 8 volts, and generally in the range of 0–2 volts is used.

FIGS. 9a and 9b show dual-cell soft programming in a virtual-ground array 900 of dual floating gate memory cells. In FIG. 9a, the floating gate transistors $\alpha_0$ and $\alpha_3$ are being soft-programmed in a first group of cells along Select Line 0 920. In similar manner, this can simultaneously be carried out in other groups of cells, such as the floating gates $\beta_0$ and $\beta_3$. Bit-line 912 is taken as the source and set to ground below the current limiter 931. The drains are then bit-lines 911 and 913, which, along with the drain neighbors such as 914, are set high. The control gate lines 942 and 943 on the source side of each of the cells are set at the overdrive voltage, here taken as 12 volts. This places the floating gate transistors $\alpha_0$ and $\alpha_3$ in an analogous situation to the cells $\alpha_2$ and $\alpha_3$ of FIG. 5. By selecting Select Line 0 920, the currents 901 and 903 flow in the cells and the transistors $\alpha_0$ and $\alpha_3$ are programmed at the same time by applying the selected soft programming voltage along the Program Control Lines 941 and 944. Unlike FIG. 5, where the control gates of the cells $\alpha_0$ and $\alpha_3$ are connected, in more general embodiment the levels in lines 941 and 944 can be set separately, although here they are taken at the same value.

As with the previous embodiment, in most cases it is preferable to continue the soft programming until a first one of the floating gate transistors in the pair verifies. Although these transistors are still in adjacent cells, the floating gate transistors themselves are not due to the intervening select transistors and the other floating gate transistors in the cell which are immediately adjacent to the source. These transistors will still be close enough so that process variations should be small, resulting in similar electrical characteristics and program rates. As the erase voltage variation along the select line will also be small over distance the order of a cell, both floating gate transistors in the soft programming pair will generally also have very similar threshold values at the end of an erase process and before the soft programming begins.

Once a pair has finished soft programming, another pair in the group can be soft programmed. When the bit-line adjacent to a bit line which was previously a source becomes the source itself, the other floating gate transistor in the cell bounded by these two bit-lines can be soft programmed. This can be made clearer by referring to FIGS. 9a and 9b. In FIG. 9a bit-line 912 acts as the source. In the cell between bit-lines 912 and 913, the right floating gate transistor $\alpha_3$ is programmed as it forms a soft programming pair with floating gate transistor $\alpha_0$. The left floating gate transistor in this cell, $\alpha_2$, is in an over drive condition during this process and is not programmed. However, $\alpha_2$ forms a pair with $\alpha_5$ and is soft programmed when bit-line 913 is taken as the source and bit-lines 912 and 914 are drains, as shown in FIG. 9b. By taking each bit-line in the group as the source, both floating gates in all of the cells in the group can be soft-programmed as part of a pair. Cells at the end of the group at either end of the array are treated separately.

As this process jumps from $\alpha_0$ to $\alpha_2$, it misses soft-programming $\alpha_1$ as this floating gate does not form a pair with another of the $\alpha_s$. Similarly, the left floating gate on the last cell in the $\alpha$ group, say $\alpha_{(n-1)}$, will be similarly unpaired. If it is also desired to soft-program these unpaired floating gates, they can be soft programmed individually. Alternately, these floating gates can also be paired with another floating gate outside their group. For instance, $\alpha_{(n-1)}$ can be paired with $\beta_1$, $\beta_{(n-1)}$ with $\gamma_1$, and so on. This still leaves $\alpha_1$, as well as the left floating gate of the last cell in the last group, unpaired. However, memory cell arrays are commonly constructed with dummy columns introduced to compensate for lithographic effects. For instance, in FIG. 9a there would be several such columns off to the left of the shown, data storing columns. Although these dummy columns are not used to store data, $\alpha_1$ can still be paired with a floating gate in the adjoining dummy column for soft programming.

More than one pair of cells may be programmed at the same time. For example, as the control gate lines run up the columns, all of the floating gate transistors in a column can be programmed together. Alternately, pairs along the same row but from different groups can be soft-programmed simultaneously.

In this second approach, while the $\alpha_0$–$\alpha_3$ pair in FIG. 9a is being soft-programmed, the $\beta_1$–$\beta_3$ pair, the $\gamma_1$–$\gamma_3$ pair, and any others not on the figure can also be soft-programmed. If several groups are being soft-programmed, these floating gates can be soft programmed until either all of the pairs in these groups verify, or until a first pair in these groups verifies. The latter case is similar to how the pair verification is performed, with the programming of other gates in the columns determined by the verification of the first pair to reach the desired state. Although cells from different groups will vary more than adjoining cells, they will still also have similar electrical characteristics and should therefore program at a similar rate. If instead every pair in the different groups is independently verified, a tighter distribution will be realized, but at the expense of time.

These two approaches are given in the flowcharts of FIGS. 10a and 10b. The process of FIG. 10a stops when a first cell pair is done soft programming. Again, as in FIG. 6, a pair is done when either floating gate has reached its target. FIG. 10b uses local program inhibit of cell pairs and continues until all of the pairs are done. Both of these flows begin after a number of rows of cells have been erased. These rows are then selected for soft programming. Only the those rows which have over-erased cells, as determined by an initial verify may be included, or all erased rows may be included, resulting in each such row receiving at least the initial soft programming pulse.

Both of FIGS. 10a and 10b begin in step 1001 at the initial column of control gate lines in each group of cells along the selected word-line. In FIG. 9a, this is the far left such line in each group, such as Control Line 941 in the $\alpha$ group and the corresponding lines in the other groups, and is designated as Y=0. This column then forms a pair with the control gate line three over, such a Control Line 944 in the $\alpha$ group, so that a pair is always composed of a floating gate transistor in an even column and an odd column. Thus if all of the even column are selected, the odd columns will also be soft programmed through this pairing.

In step 1003, the programming voltage is set in the column pair by the biasing circuitry in the Y-decoders of the array. In step 1005, all of the transistors in the selected column pairs receive a soft programming pulse followed by setting the control gate lines to the verify voltage in step 1007. The verification occurs in step 1009.

The verification process differs between FIG. 10*a* and FIG. 10*b*. In FIG. 10*a*, the criterion is whether any of the pairs verify and are thus done. If not, this corresponds to none_done==1 and the process loops back to step 1003. If any pair verifies, this corresponds to none_done==0 and the process moves on to step 1011. As before, a pair verifies when either floating gate in the pair is no longer over-erased In FIG. 10*b*, all_done is instead used of none_done as the criterion; that is, here step 1009 determines whether all of the cell pairs are done. If they have not all verified, corresponding to all_done==0, the process loops back to step 1003 by passing through step 1010 in which cell pairs in which either or both floating gates verify are locked out by taking their control gate and/or bit-line low and thereby inhibit any further programming. If instead all of the pairs are done, corresponding to all_done==1, the flow moves on to step 1011. The process of FIG. 10*b* yields a tighter $V_{th}$ distribution, but at the expense of more time. When the manufacturing process of the device has matured so that the cells have more similar characteristics across the array, the process of FIG. 10*b* may be preferred. For example, in the development and early production stages, the FIG. 10*a* process may be used and then switched to the FIG. 10*b* process.

In both methods, step 1011 increments the control address by 2 in the group. This corresponds to moving from the situation of FIG. 9*a* to that in FIG. 9*b*: The selected control line pair changes from (941, 944) to (943, 946) and the source moves from bit-line 912 to 913, and similarly for the β, γ, and other groups. Step 1013 checks whether the column address is still within the number of columns in a group. If so, the process returns to step 1003; if not, all of the columns have been soft programmed and both processes are done.

Although the various aspects of the present invention have been described with respect to specific exemplary embodiments, it will be understood that the invention is entitled to protection within the full scope of the appended claims.

It is claimed:

1. A method of treating erased memory cells in a non-volatile memory having a plurality of memory cells forming a virtual ground array comprised of one or more rows of said cells, each of said memory cells capable of storing a plurality of data states and comprising a first source/drain region and a second source/drain region, wherein the source/drain regions are connected to bit lines perpendicular to said rows, the method comprising:

sensing the presence of a memory cell from said plurality of memory cells erased to a state other than one of said plurality of data states; and subsequent to sensing the presence of said memory cell erased to a state other than one of said plurality of data states, simultaneously performing a soft programming operation on a pair of memory cells consisting of said memory cell erased to a state other than one of said plurality of data states and the memory cell with which said memory cell erased to a state other than one of said plurality of data states shares a bit line to which both of said pair of memory cells have their respective second source/drain region connected.

2. The method of claim 1, wherein said pair is soft programmed only if both cells of the pair are erased to a state other than one of said plurality of data states.

3. The method of claim 2, further comprising:

subsequent to said soft programming operation, sensing whether said pair of memory cells remain erased to a state other than one of said plurality of data states.

4. The method of claim 3, further comprising:

responsive to said sensing whether said pair of memory cells remain erased to a state other than one of said plurality of data states, alternately repeating said soft programming operation and said sensing whether said pair of memory cells remain erased to a state other than one of said plurality of data states as long as said pair of memory cells remain erased to a state other than one of said plurality of data states.

5. The method of claim 4, wherein said soft programming operation comprises applying to a control gate of each of said pair of memory cells a soft programming voltage that is less than a standard programming voltage.

6. The method of claim 5, wherein said soft programming is performed using a voltage in the range of from four volts to seven volts for said first source/drain region of said pair of memory cells.

7. The method of claim 1, wherein said memory cells are source-side injection Electrically Erasable and Programmable Read Only Memory (EEPROM) cells and wherein said second source/drain region is a source.

8. The method of claim 7, wherein said soft-programming operation is by source-side injection.

9. The method of claim 1, wherein said memory cells are Electrically Erasable and Programmable Read Only Memory (EEPROM) cells and each of said memory cells further comprises a channel region having a first and a second portion lying between and respectively adjacent to said first and second source/drain regions, a first floating gate above said first portion of said channel region, a first control gate having a portion above said first floating gate, a second floating gate above said second portion of said channel region and a second control gate having a portion above said second floating gate, and wherein each of said memory cells further comprises a third channel region lying between said first and second channel regions and a select gate having a portion above said third portion of said channel region.

10. The method of claim 9, wherein said simultaneous soft-programming operation is performed on the first floating gate of each of said pair of memory cells.

11. The method of claim 10, wherein said simultaneous soft-programming operation includes applying a voltage to said second control gate of each of said pair of memory cells sufficient to allow current to flow freely through said second portion of the channel region whereby said soft programming is performed on only the first floating gate of each of said pair of memory cells.

12. The method of claim 11, wherein said soft programming operation comprises applying a voltage to said first control gates a soft programming voltage that is less than a standard programming voltage.

13. The method of claim 12, wherein said soft programming is performed using a voltage in the range of from four volts to seven volts for said first source/drain region of said pair of memory cells.

14. The method of claim 11, wherein said soft programming is performed using a voltage in the range of from four volts to seven volts for said first source/drain region and said voltage to said second control gate sufficient to current to flow freely through said second portion of the channel region is a voltage in the range of from eight volts to twelve volts.

15. The method of claim 9, wherein said simultaneous soft-programming operation is performed using applying to said select gate of each of said pair of memory cells a voltage in the range of from 1.5 volts to 3 volts.

16. A method of treating a plurality of memory cells in a non-volatile memory, each of said memory cells comprising a source region and a drain region, wherein said cells are arranged in pairs having their sources connected to a shared bit line and forming an array comprised of one or more rows of said cells, and wherein the bit lines run perpendicular to said rows, the method comprising:

sensing the presence of one or more over-erased memory cells from said plurality of memory cells; and subsequent to sensing the presence of one or more over-erased memory cells, simultaneously performing a soft programming operation on said at least one of said one or more over-erased memory cells and the respective memory cell with which each of said at least one over-erased memory cell forms a pair.

17. The method of claim 16, further comprising:

erasing said plurality of memory cells prior to said sensing.

18. The method of claim 17, wherein a soft programming operation is performed on a pair of cells only if both cells in the pair are over-erased.

19. The method of claim 18, further comprising:

subsequent to said soft programming operation, sensing whether the memory cells that have been soft programmed remain over-erased.

20. The method of claim 19, further comprising:

repeating said soft programming and subsequent sensing, discontinuing when a first cell that has been soft programmed is no longer over-erased.

21. The method of claim 19, further comprising:

repeating said soft programming and subsequent sensing, discontinuing for each over-erased pair of cells when a first cell of the pair is no longer over-erased.

22. A method of treating a non-volatile memory having a plurality of memory cells forming a virtual ground array comprised of a plurality of columns and of one or more rows, wherein the columns are arranged in a plurality of independently writable groups, the method comprising:

sensing a first adjacent pair of over-erased cells from each of one or more write groups in a row; and simultaneously performing a soft programming operation on the sensed first adjacent pair(s) of over-erased cells.

23. The method of claim 22, further comprising:

erasing said row prior to said sensing.

24. The method of claim 22, further comprising:

subsequent to said soft programming operation, sensing whether the memory cells that have been soft programmed remain over-erased; and repeating said soft programming and subsequent sensing until at least one of said cells that have been soft programmed is no longer over-erased.

25. The method of claim 24, further comprising:

subsequent to said repeating, sensing a second adjacent pair of over-erased cells from each of one or more write groups in a row; and simultaneously performing a soft programming operation on the sensed second adjacent pair(s) of over-erased cells.

26. The method of claim 22, further comprising:

subsequent to said soft programming operation, sensing whether the memory cells that have been soft programmed in each of said first adjacent pair(s) remain over-erased; and repeating said soft programming and subsequent sensing in those first adjacent pair(s) where both cells remain over-erased until a cell in first cell of the pair is no longer over-erased.

27. The method of claim 26, further comprising:

subsequent to said repeating, sensing a second adjacent pair of over-erased cells from each of one or more write groups in a row; and simultaneously performing a soft programming operation on the sensed second adjacent pair(s) of over-erased cells.

28. A method programming an array of non-volatile memory cells, comprising:

erasing a plurality of said memory cells;

selecting a plurality of said erased cells for programming;

simultaneously programming said selected memory cells; and ceasing programming of all of said selected memory cells when at least one but less than all of said selected memory cells are verified programmed to a desired state.

29. The method of claim 28, wherein said selected memory cells are pairs of cells, where each of the cells in a pair share a common bit-line.

30. The method of claim 29, wherein said ceasing programming is done for each pair independently when a first cell of the pair is verified programmed to a desired state.

* * * * *